US010404232B2

(12) United States Patent
Rezk et al.

(10) Patent No.: US 10,404,232 B2
(45) Date of Patent: Sep. 3, 2019

(54) PIEZOELECTRIC ACTUATION PLATFORM

(71) Applicant: ROYAL MELBOURNE INSTITUTE OF TECHNOLOGY, Melbourne (AU)

(72) Inventors: Amgad Rezk, Victoria (AU); Leslie Yeo, Victoria (AU); James Friend, Oakleigh East (AU)

(73) Assignee: Royal Melbourne Institute of Technology, Melbourne (AU)

( * ) Notice: Subject to any disclaimer, the term of this patent is extended or adjusted under 35 U.S.C. 154(b) by 524 days.

(21) Appl. No.: 15/029,433

(22) PCT Filed: Sep. 30, 2014

(86) PCT No.: PCT/AU2014/050259
§ 371 (c)(1),
(2) Date: Apr. 14, 2016

(87) PCT Pub. No.: WO2015/054742
PCT Pub. Date: Apr. 23, 2015

(65) Prior Publication Data
US 2016/0301381 A1    Oct. 13, 2016

(30) Foreign Application Priority Data

Oct. 17, 2013   (AU) ................................ 2013903999

(51) Int. Cl.
*H01L 41/09*     (2006.01)
*H01L 41/047*    (2006.01)
(Continued)

(52) U.S. Cl.
CPC ........... *H03H 9/25* (2013.01); *B01L 3/50273* (2013.01); *B05B 17/0661* (2013.01);
(Continued)

(58) Field of Classification Search
CPC ... H03H 9/25; B01L 3/50273; B05B 17/0661; B05B 17/0684; H01L 41/047; H02N 2/16
(Continued)

(56) References Cited

U.S. PATENT DOCUMENTS 3,790,709 A * 2/1974 Heywang .............. G06F 3/0433
                                                      178/18.05
4,742,319 A   5/1988 Sone
(Continued)

FOREIGN PATENT DOCUMENTS

JP    2010-136317 A    6/2010
JP    2010-220204 A    9/2010
WO    WO 2007/128045 A1    11/2007

OTHER PUBLICATIONS

Yeo et al., "Surface Acoustic Waves: A New Paradigm for Driving Ultrafast Biomicrofluidics", Proceedings of the ASME 2009 2nd Micro/Nanoscale Heat & Mass Transfer International Conference, Dec. 18-21, 2009, 1-8.
(Continued)

*Primary Examiner* — Thomas M Dougherty
(74) *Attorney, Agent, or Firm* — BakerHostetler (57) ABSTRACT

A piezoelectric actuation platform (1) including piezoelectric substrate (3) formed from a single crystal piezoelectric material, and at least one simple electrode (5) in contact with the piezoelectric substrate for applying an electrical signal to the substrate such that a lamb or surface acoustic wave can be generated within said substrate.

8 Claims, 10 Drawing Sheets

(51) Int. Cl.
    *H03H 9/25* (2006.01)
    *B01L 3/00* (2006.01)
    *B05B 17/06* (2006.01)
    *H02N 2/16* (2006.01)
(52) U.S. Cl.
    CPC ........ *B05B 17/0684* (2013.01); *H01L 41/047* (2013.01); *H02N 2/16* (2013.01); *B01L 2300/12* (2013.01); *B01L 2400/0415* (2013.01)
(58) Field of Classification Search
    USPC ............. 310/313 A–313 D, 313 R, 365, 366; 333/187–193
    See application file for complete search history.

(56) References Cited

U.S. PATENT DOCUMENTS

| | | | | |
|---|---|---|---|---|
| 6,295,247 | B1* | 9/2001 | Khuri-Yakub | B06B 1/0292 367/140 |
| 2008/0048804 | A1* | 2/2008 | Volatier | H03H 9/02228 333/191 |
| 2010/0139377 | A1 | 6/2010 | Huang et al. | |
| 2011/0037539 | A1* | 2/2011 | Jansman | H03H 9/02118 333/187 |
| 2011/0187227 | A1* | 8/2011 | Chen | H03H 3/007 310/318 |
| 2012/0187209 | A1 | 7/2012 | Friend et al. | |
| 2013/0342285 | A1* | 12/2013 | Kadota | H01G 7/06 333/188 |
| 2014/0306581 | A1* | 10/2014 | Garland | C30B 33/04 310/360 |

OTHER PUBLICATIONS

European Patent Application No. 14853674.1: Supplementary European Search Report dated May 2, 2017, 7 pages.

* cited by examiner

PIEZOELECTRIC ACTUATION PLATFORM

CROSS-REFERENCE TO RELATED APPLICATIONS

This application is the National Stage of International Application No. PCT/AU2014/050259 filed Sep. 30, 2014, which claims the benefit of Australian application number 2013903999, filed Oct. 17, 2013, the disclosures of which are incorporated herein by reference in their entireties.

FIELD OF THE INVENTION

The present invention is generally directed to piezoelectric actuated apparatus, and in particular to a piezoelectric actuation platform for use in such apparatus.

BACKGROUND TO THE INVENTION

Ceramic, polycrystalline materials such as lead zirconate titanate (commonly known as 'PZT'), are commonly selected as a substrate for a piezoelectric actuation platform because this material offers large electromechanical coupling coefficients, $k_t^2$, being the ratio between the produced mechanical energy to the input electrical energy. The presence of lead in PZT however limits its potential uses in consumer and medical technology. In order to provide a lead free substrate, the use of single crystal piezoelectric materials not containing leads, such as lithium niobate ($LiNbO_3$) has therefore been considered for use in such applications.

Compared with PZT and other ceramic, polycrystalline materials that offer large electromechanical coupling coefficients, $k_t^2$, the use of single crystal, piezoelectric material is traditionally viewed as only reasonable for very high frequency (VHF) devices and up, from ~1 MHz to ~100 GHz in frequency. These single crystal piezoelectric materials include, but are not limited to, bulk lithium niobate, thin film lithium niobate, bulk lithium tantalate, thin film lithium tantalate, Gallium Nitride, Quartz and Langasite. This is principally due to their relatively low $k_t^2$. However, the large quality factor, Q, and associated low damping of single crystal materials are an important aspect. The quality factor for Lithium Niobate is around 20,000, while the quality factor of PZT, even under the most ideal of conditions, is only around 1000 for very low frequencies.

There is a mistaken perception that $Q_m$ (PZT) remains at this value for frequencies up to a few MHz, and that the $k_t^2$ coefficients of single crystal materials like Lithium Niobate are simply too small to justify use of these materials in comparison to PZT and other similar polycrystalline piezoceramic materials whatever the Q values might be.

High frequency devices working at frequencies between 1 MHz to 10 GHz, are ideal for micro to nano-scale actuator devices due to the short wavelengths and, in particular, very large accelerations that can be generated at such high frequencies. Because the maximum particle velocity that can be induced in a solid material, being about 1 m/s, is roughly independent of frequency, therefore for frequencies from less than 1 kHz to greater than 10 GHz, the acceleration that can be induced increases linearly with the frequency. This acceleration is around 6 million times the acceleration of gravity when using a 10 MHz device, and greater than 600 million times the acceleration for a 1 GHz device. Such devices therefore represent one of the most powerful means of driving acceleration known, apart from particle accelerators. These accelerations can be used to propel fluid and solid objects at the micro scale in a variety of creative ways that are now appearing in applications from robotics to biomedicine. What is needed is a means to efficiently generate such acceleration. The current state-of-the-art as described in patent and academic literature, and particularly in telecommunications do not address this need nor describe a way to do so.

Indeed, an appropriate figure of merit is needed for the piezoelectric material, a quantity that defines the potential performance of the material for a specific application. This figure of merit value has in the past been defined by the product of $k_t^2$ and $Q_m$. This value can be quite large for Lithium Niobate, for example, and larger than PZT for practical applications of the materials in microdevices, a fact not recognised in the currently available literature. The very large values of Q in single crystal materials compared to bulk materials therefore overwhelms the discrepancy in $k_t^2$ values.

The overwhelmingly common use of single-crystal piezoelectric material such as Lithium Niobate is in generating and using surface acoustic waves, taking advantage of the low losses, large energy density, and various other features of surface waves. Unfortunately, the use of Lithium Niobate typically requires the deposition of electrodes upon its surface using photolithography. Forming such electrodes requires cleanroom faculties and precision techniques to fabricate such structures, representing an initial cost for establishment or access to such a facility and ongoing costs in fabricating devices.

While it is possible to generate bulk waves in single crystal piezoelectric materials with large electrodes across exposed faces of these materials, few applications make use of this ability, with virtually all bulk wave applications of piezoelectric materials instead using PZT, ZnO and other polycrystalline materials.

Vibrations generated in piezoelectric materials with standard large electrodes are typically simple in form: i.e. thickness, radial, or shear, with no phase shift across the vibrating structure. Large electrodes have dimensions that cover a significant portion of the surface of the piezoelectric substrate they are in contact with.

Small electrodes, of dimensions of the wavelength/2 or less along the vibration propagation direction but long across the propagation direction (usually many multiples of the wavelength), are used for generating surface or bulk acoustic waves possessing wavelengths that are small in comparison to the dimensions of the piezoelectric material the vibrations are being generated in. Furthermore, typically such electrodes have repeated patterns (i.e., interdigital electrodes with numerous "finger pairs" for Rayleigh SAW or Lamb waves or Love waves); the number of repetitions is usually chosen based on a desire to match impedances or achieve a desired bandwidth for the transducer. Such electrodes are typically required to be deposited on the surface of the piezoelectric material using photolithographic fabrication processes.

It would be advantageous to be able to have a piezoelectric actuation platform that avoids the need for electrodes to be deposited on the piezoelectric substrate surface using photolithography.

It would also be advantageous to be able to use at least one simple electrode, either a large electrode or small point electrode, to generate vibrations with wavelengths that are short in comparison to the dimensions of the vibrating piezoelectric material.

SUMMARY OF THE INVENTION

According to one aspect of the present invention, there is provided a piezoelectric actuation platform including a piezoelectric substrate formed from a single crystal piezoelectric material, and at least one simple electrode contactable with the piezoelectric substrate for applying an electrical signal to the substrate such that a lamb or surface acoustic wave can be generated within said substrate.

The single crystal piezoelectric material may preferably be selected from one of the following group: bulk lithium niobate, thin film lithium niabate, bulk lithium tantalate, thin film lithium tantalate, Gallium Nitride, Quartz, and Langasite.

The simple electrode may be in contact with a surface of the piezoelectric substrate. Alternatively, the simple electrode may be in the form of a conducting material sputtered on a surface of the piezoelectric substrate. The conducting material may for example be a metal such as gold.

As the simple electrode is not deposited on the piezoelectric substrate surface using photolithographic processes, it is not necessary for that surface to be polished. Therefore, the piezoelectric substrate surface may be left unpolished further reducing production costs.

According to a preferred embodiment of the piezoelectric actuation platform according to the present invention, the simple electrode may be a large electrode in contact with a significant portion of the piezoelectric substrate surface. The electrode may be in the form of a conductive sheet material which may be in a variety of different shapes including L-shaped, strip shaped, curved or circular shaped.

According to another preferred embodiment of the invention, the simple electrode may be a point electrode in contact with a point on the surface of the piezoelectric substrate surface.

It is also preferable for the electrical signal applied to the piezoelectric substrate to be at a frequency substantially matching one or more resonant frequencies of the piezoelectric substrate. This allows the piezoelectric actuation platform according to the present invention to operate at different frequencies for different applications.

The present invention utilizes one or more simple electrodes to apply an electrical signal to the piezoelectric substrate, and does not require electrode material to be deposited on a surface of the piezoelectric substrate utilizing photolithography. This drastically reduces the cost for fabrication of the piezoelectric actuation platform according to the present invention.

Furthermore, the use of simple electrodes in combination with single crystal materials achieves very large values for the figure of merit, and allows large amplitude ultrasonic waves to be formed in the piezoelectric substrate. The present invention is useful for a variety of applications, and does not require complex fabrication techniques, or the need to resort to lead-based or polycrystalline materials to achieve these results.

The combination of simple electrodes and single crystal piezoelectric materials provides a very attractive solution for many applications. For example, the present invention may be used in the manipulation of liquid droplets, or fluids in enclosed micro to nanofluidic devices, or in the jetting, mixing, and nebulisation of such liquids. The present invention may also be used in the manipulation of particles and cells within these liquids for a broad variety of applications in chemistry and medicine.

Furthermore, specific benefits offered by the use of single crystal piezoelectric material add to the advantages presented by the favourable figure of merit. These benefits arise due to the transparency of LN, LT, and Quartz enabling optical devices and applications, the semiconducting qualities of GaN and associated ability to generate coherent light in that material for lasers, monolithic integrated circuits containing amplification, memory, computation, and additional sensing features for monolithic lab-on-a-substrate applications, and the absence of lead from all these materials and therefore the reduction of lead-based materials in consumer and medical technology that employ these devices, making the technology environmentally safe and compliant with stringent international rules regarding the elimination of lead from all consumer devices by 2020.

There is also the advantage in some embodiments of the absence of a coherent propagating wave, helpful for providing acoustic energy to more than one location that may be "shadowed" by another location.

BRIEF DESCRIPTION OF THE FIGURES

The present invention will now be described with reference to the accompany figures which show preferred examples of a piezoelectric actuation platform according to the present invention, as well as experimental results and data obtained using the present invention. Other examples are also envisaged, and consequently, the particularity of the accompanying drawings is not to be understood as superseding the generality of the preceding description of the invention.

DETAILED DESCRIPTION OF THE INVENTION

The fabrication process for the piezoelectric actuation platform according to the present invention preferably involves three different strategies. The first strategy uses a simple electrode configuration where a metal such as an aluminum strip is brought into physical contact with lithium niobate for actuation. when an AC current is applied. In a second strategy, for relatively more precious electrode materials, the fabrication process is conducted by masking portions of the lithium niobate surface using a predefined 'shadow' mask, using high quality tape for example, and then by sputtering the surface with a conducting, material—such as gold—followed by peeling of the tape. A third strategy involves sputtering gold on the lithium niobate surface, printing a design on paper and transferring the ink/pattern onto the lithium niobate surface by heat, especially using a standard laminator, followed by etching the remaining bare gold. It is noted that in the case of Lamb waves, the electrodes can be on one side of the lithium niobate block while the working surface where, for example microfluidic actuation can occur is on the opposing side. This can be achieved because Lamb waves are a type of bulk waves. This is advantageous in the case where conductive fluids are used as this avoids short-circuiting should the fluid come in contact with the electrode metal. The surface of the piezoelectric substrate is normally required to be polished when the electrodes need to be deposited using photolithography. According to the present invention, the surface does not need to be polished and may therefore be left unpolished.

Figure 1:
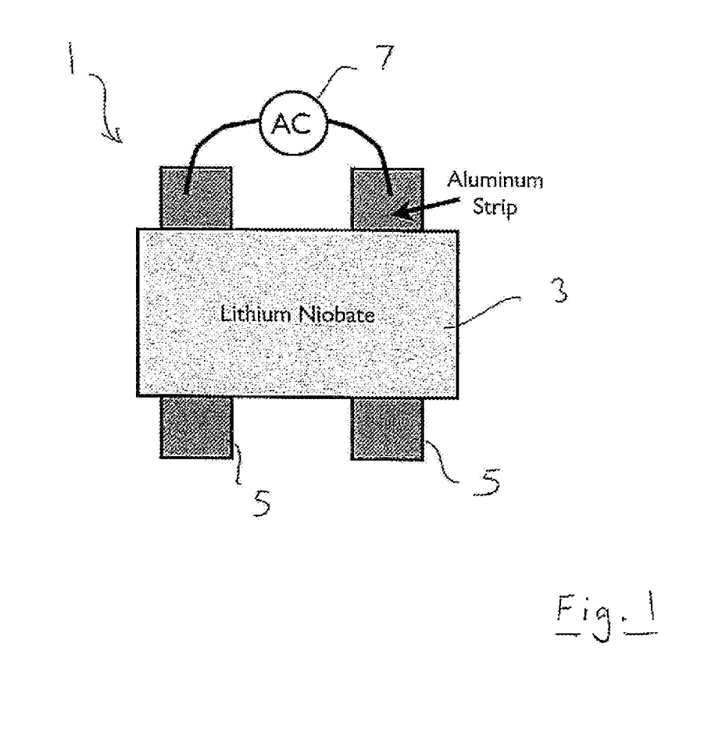
FIG. 1 shows a plan view of one example of the very simple electrode configuration that can be used for a piezoelectric actuation platform according to the present invention.
Figure 2:
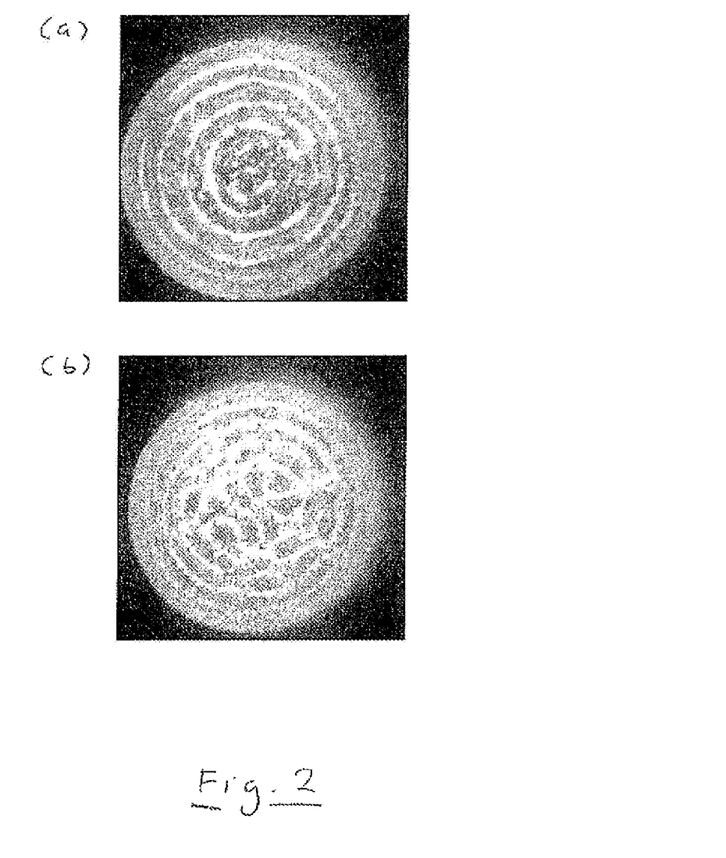
FIGS. 2a and 2b respectively show particle patterning with a well defined structure of particles suspended within a liquid droplet located on a surface of the piezoelectric actuation platform prior to actuation, and following the application of a very low input power.
Figure 3:
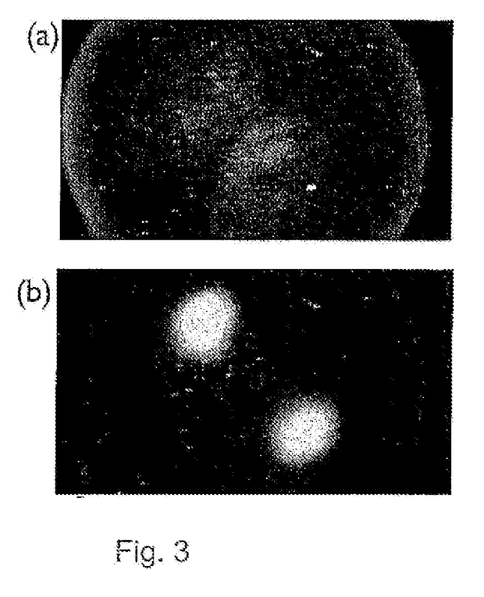
FIGS. 3a and 3b respectively shows the behaviour of articles suspended within a liquid droplet located on a surface of the piezoelectric actuation platform prior to actuation, and following the application of input power at a slightly higher level than in the experiment shown in FIGS. 2a and b.
Figure 4:
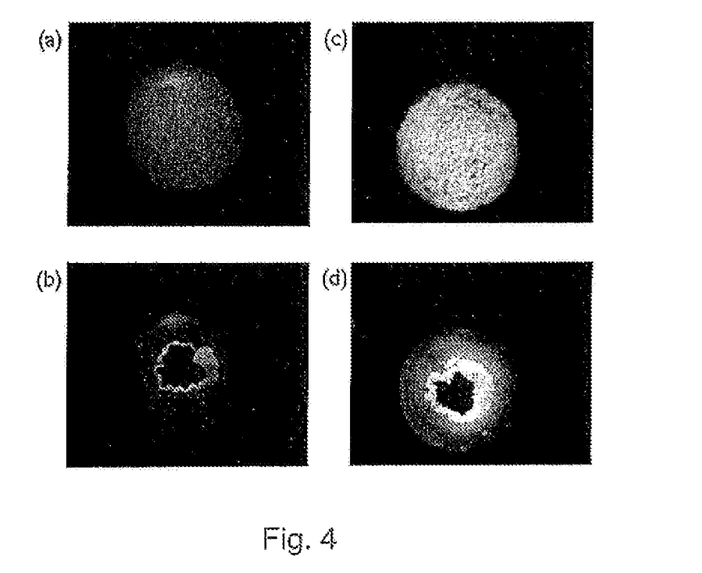
FIGS. 4a to 4d shows the change in behaviour of particles suspended within a liquid droplet located on a surface of the piezoelectric actuation platform as the location of the liquid droplet on the surface is varied, prior to the actuation in 4a and 4c and following the application of the waves in 4b and 4d.
Figure 5:
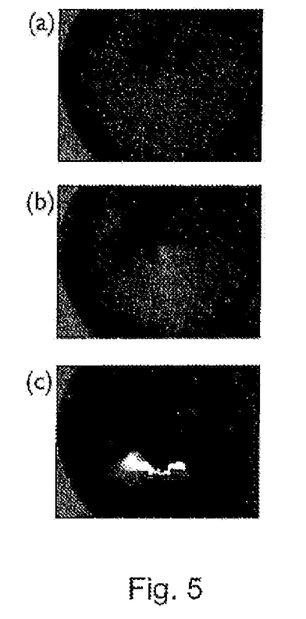
FIGS. 5a to 5c shows a particle concentration mechanism where upon increasing the input power, the poloidal ring formation, shown in FIG. 4, becomes unstable and breaks then being followed by concentration along the ring radial line.
Figure 6:
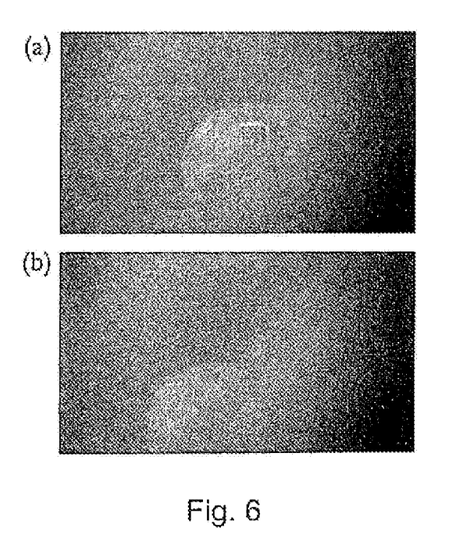
FIGS. 6a and 6b respectively show the spinning motion and the translation of a liquid droplet located on an inclined surface of the piezoelectric actuation platform according to the present invention.
Figure 7:
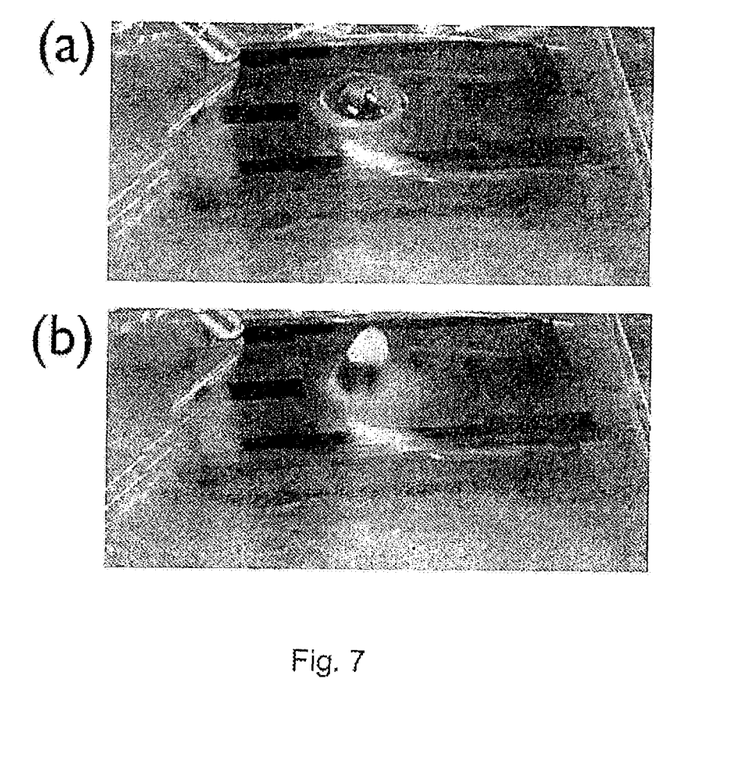
FIGS. 7a and 7b respectively shows the shape of a liquid droplet located on a surface of the piezoelectric actuation platform according to the present invention prior to actuation, and the distortion of a liquid droplet following application of an input power.
Figure 8:
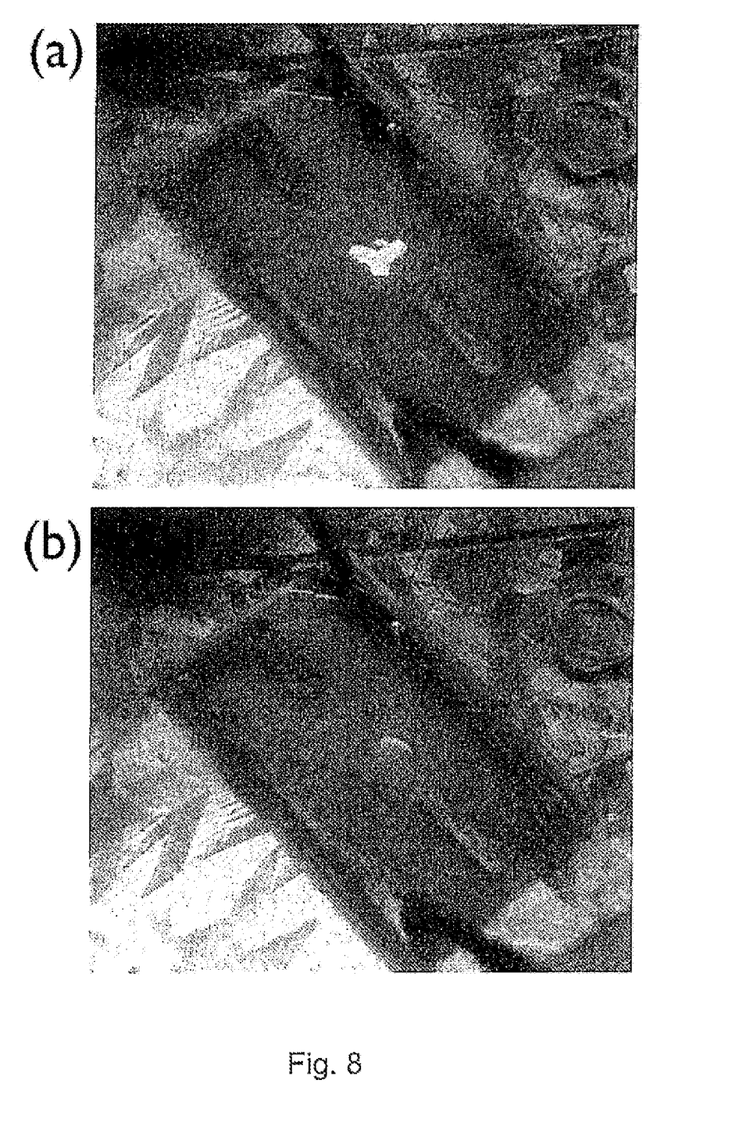
FIGS. 8a and 8b respectively shows a rotor shaped object placed within a liquid droplet located on a surface of the piezoelectric actuation platform according to the present invention prior to actuation, and the rotation of the rotor shaped object following the application of an input power.
Figure 9:
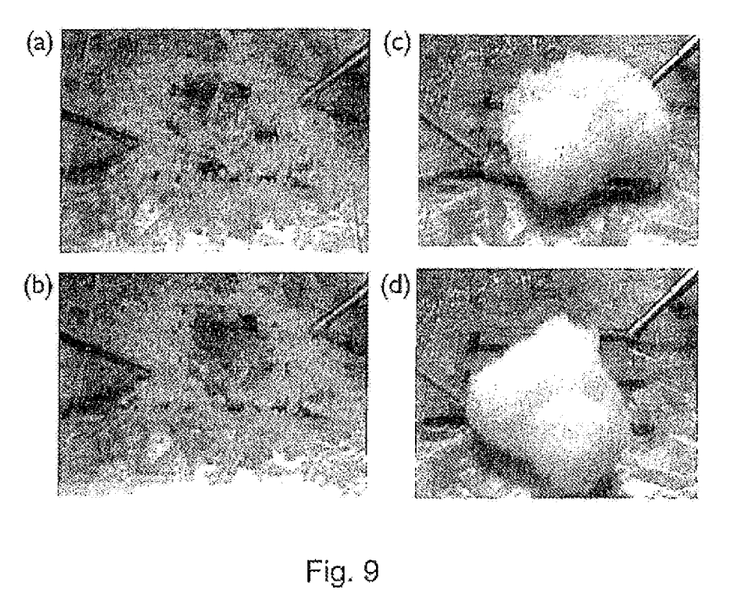
FIGS. 9a to 9d respectively shows the displacement of various solid objects located on a surface of the piezoelectric actuation platform according to the present invention.

FIG. 1 is a plan view of a piezoelectric actuation platform 1 according to the present invention. The piezoelectric substrate used in the experimentation was lithium niobate. The present invention is not however restricted to this material, and other single crystal piezoelectric materials could also be used. That platform 1 includes a piezoelectric substrate 3 formed from a single crystal piezoelectric material such as lithium niobate. A pair of aluminium strips 5 connected to a power supply is brought into physical contact with the piezoelectric substrate 3. Only one example of the configuration of the electrode 7 is shown in FIG. 1, and other configurations are also possible. Therefore, the electrodes configuration may include L-shaped electrodes, one or more spot electrodes, line shaped electrodes, curved electrodes or circular electrodes. For example, a single point contact electrode reliant on a floating ground could be used. The power supply 7 can provide an ultrasonic signal that corresponds to one or more of the resonant frequency of the $LiNbO_3$ substrate. The significant of this is that multi resonances are present for one single piezoelectric actuation platform, allowing different applications at different frequencies. We also note that the resonances are proportional to the lithium niobate thickness and could be altered by changing its thickness.

FIGS. 2 to 12 illustrate various experimental results and data obtained on experiments conducted on piezoelectric actuation platform 1 according to the present invention. FIG. 1 shows an atomizer apparatus using the described piezoelectric platform 1.

FIGS. 2a and b respectively show particles suspended within a liquid droplet located on the surface of the piezoelectric substrate platform. FIG. 2a shows the particles distributed through the liquid droplet after power is applied to the platform. Application of a very low input power in the order of between 0.1 to 0.2 watts results in the particles aggregating together to form distinctive patterns due to the acoustic radiation. Such particle aggregation can be used for various particle trapping and isolation applications.

When a slightly higher input power of between 0.2 to 0.4 watts is applied to the piezoelectric actuation platform, different behaviour is observed in the aggregation of particles suspended within a fluid droplet located on the platform surface. Depending on the location of the liquid droplet with respect to the electrode, particles can rotate within the liquid due to the poloidal flow within that droplet to form two island concentration spots as shown in FIG. 3b. The increase in fluorescent intensity by concentration of the particles has potential applications in sensing, and especially with respect to bio-molecules.

FIGS. 4a to 4d shows the effect that varying the location of the liquid droplet relative to the electrode on the piezoelectric actuation platform surface can have on the behaviour of particles suspended within that liquid droplet. In the experiments, an input power of between 0.2 to 0.4 watts was applied to the platform 1. Varying the location of the liquid droplet resulted in the particles suspended within the liquid droplet aggregating in different patterns, or the particles rotating within the droplet due to the induced poloidal flow within the droplet to form a ring concentration pattern as best shown in FIGS. 4b and 4d.

A unique particle concentration mechanism and application is shown in FIGS. 5a to 5c where, strong poloidal flow leads to particle ring formation followed by ring instability and eventually particle aggregation along a radial line within the drop. Particle concentration has a wide of applications, especially with biosensing where the optical signal increases a million fold after concentrating particles/lab-molecules.

Application of power to the piezoelectric actuation platform can also result in displacement of the fluid droplet on the platform surface. FIGS. 6a and 6b respectively show a liquid droplet located on the piezoelectric actuation platform surface, which has been inclined at any angle relative to a horizontal plane. Application of a slightly higher input power greater than 0.5 watts in the experiments resulted in the vibration and spinning of the liquid droplet as shown in FIG. 6a. Furthermore, the liquid droplet would also move under the influence of gravity due to the contact line of the drop being unpinned due to the inclination of the platform surface as shown in FIG. 6b. The displacement of the liquid droplet can alternatively be achieved by breaking the spatial symmetry of the electrodes, using asymmetric electrodes shape or by creating asymmetry in the chip's edge or strategically placing the drop so that only portions of the drop is exposed to the acoustic waves. The ability to displace a liquid droplet located on the platform surface has applications in the lab-on-a-chip (LOC) field.

Applying a higher input power to the piezoelectric actuation platform can also result in distortion of the liquid droplet interface. FIGS. 7a and 7b respectively shows a liquid droplet prior to application of power as shown in FIG. 7a, and following the application of an input power of above 0.5 watts. This results in the liquid droplet forming a conical shape which can then eventually breaks up and form a liquid jet. Such liquid behaviour could be useful for printing applications as well as in viscosity measurement applications.

The piezoelectric substrate platform according to the present invention can also be used in micro engineering applications. FIGS. 8a and 8b respectively show a rotor-shaped object place within the liquid droplet when stationary as shown in FIG. 8a prior to actuation of the piezoelectric platform, or rotating as shown in FIG. 8b following actuation. The experiment involved the application of an input power of around 0.5 watts which resulted in rotation of the liquid within the liquid droplet forcing the rotation of the rotor shaped object.

The piezoelectric actuation platform according to the present invention could also be used to move other relatively large objects weighing a few grams. FIGS. 9a and 9b show the movement of a cluster of salt grains following the application of an input power to the piezoelectric actuation platform. FIGS. 9c and 9d similarly show the movement of a large cluster of salt following the application of an input power to the piezoelectric actuation platform. This demonstrates the potential application of the piezoelectric actuation platform as a surface cleaner.

The piezoelectric actuation platform according to the present invention can also be used in the atomisation of liquid. FIGS. 10a and 10b respectively shows a liquid droplet on the piezoelectric platform surface prior to any input power being applied to the platform, and the liquid being converted to a mist in FIG. 10b following application of an input power of between 0.7 to 2 watts to the piezoelectric actuation platform.

Figure 11:
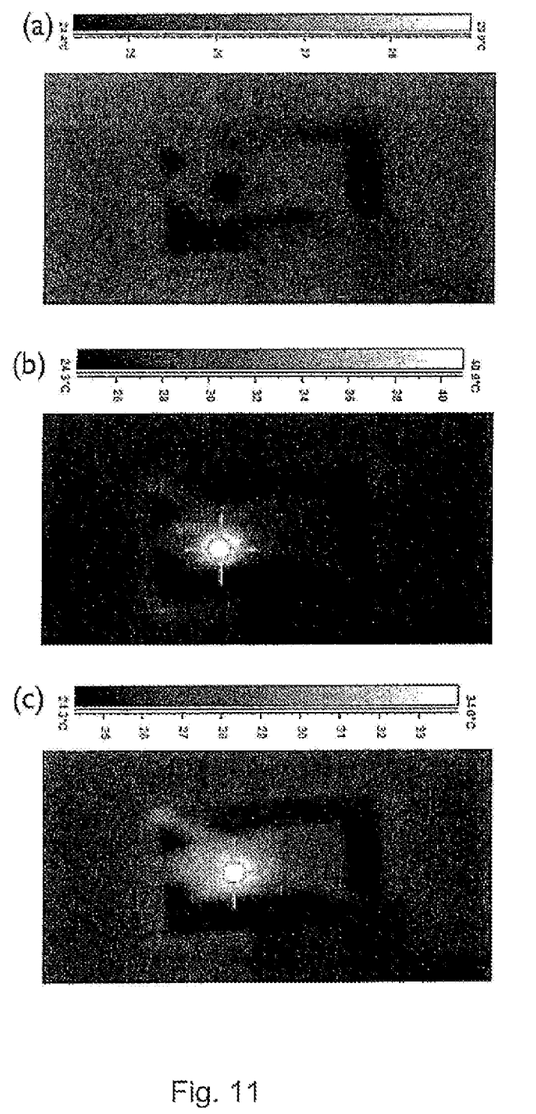
FIGS. 11a to 11c respectively show infrared images of the heat distribution within a piezoelectric actuation platform according to the present invention prior to actuation, during actuation, and immediately following actuation.

FIG. 11 various infrared images of the heat distribution of the piezoelectric actuation platform according to the present invention prior to the input power being applied (FIG. 11a) during the application of an input power (FIG. 11 b), and immediately after the input power has been discontinued (FIG. 11 c). These images show that the overall heat generation is significantly lower in the present invention where simple electrodes are used when compared to piezoelectric actuation platforms using inter-digital transducers where temperatures can be in the order of between 60-95° C. In fact, conventional IDTs have been used as a drop heater and other PCR applications which requires high temperatures. By comparison, the maximum temperature observed in the piezoelectric substrate platform according to the present invention is in the order of around 40 degrees Celsius. The lower operating temperatures can allow the platform to be used in a greater variety of applications where high temperature needs to be avoided. The piezoelectric actuation platform according to the present invention may for example be used in the manipulation of heat sensitive bio-material. Furthermore, lower operational temperatures can increase the reliability of that apparatus using a piezoelectric actuation platform according to the present invention.

Figure 10:
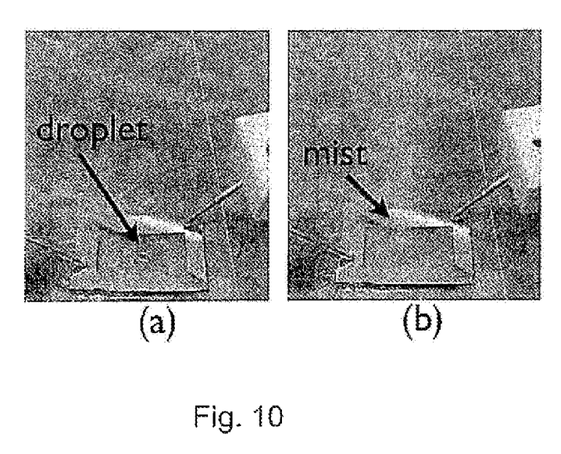
FIGS. 10a and 10b respectively shows a liquid droplet on the piezoelectric actuation platform according to the present invention prior to actuation, and the atomisation of that liquid droplet located on a surface of the piezoelectric actuation platform following the application of an input power.
Figure 12:
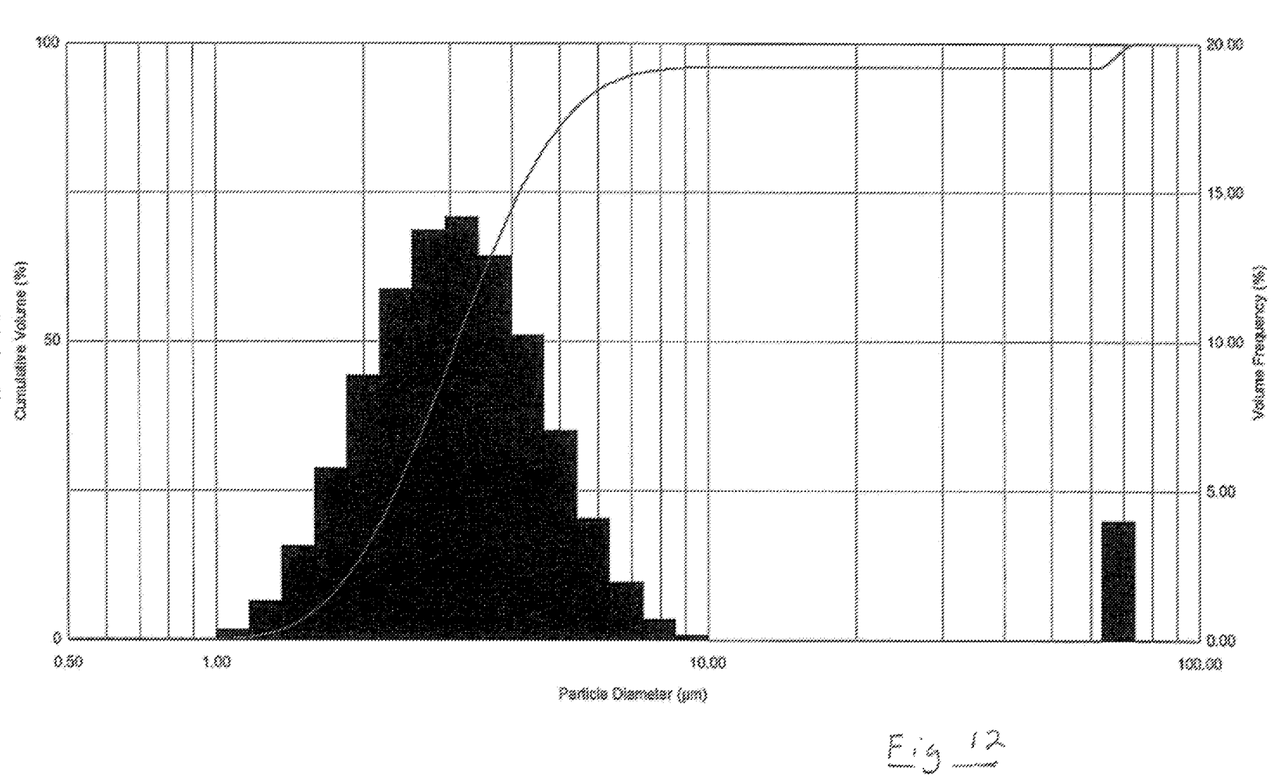
FIG. 12 is a graph showing the drop sized distribution of atomized drops from a liquid droplet located on surface of the piezoelectric actuation platform according to the present invention.
Figure 13:
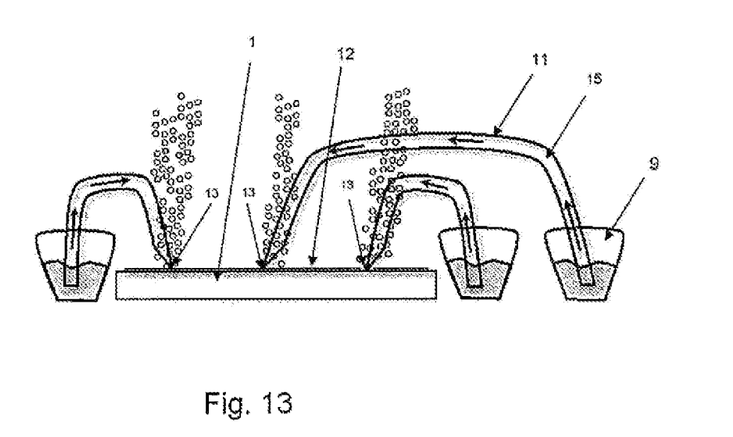
FIG. 13 is a schematic side view of an atomiser apparatus using the piezoelectric actuation platform according to the present invention.

FIG. 12 shows a graph of the drop size distribution of atomised drops produced in the arrangement shown in FIG. 10. As shown in the results, the atomized drops have a monodispersed distribution as well as a small size (below 5 microns) rendering them ideal for many practical applications, especially for drug delivery to the lungs FIG. 13 is a schematic diagram showing an atomizer apparatus using the piezoelectric actuator platform 1 according to the present invention. One or more liquid reservoirs 9 can supply liquid to the platform surface 12. A wick formed from paper, fabric or other hydrophilic material may extend from the reservoir 9 to the platform surface 12. The wick 11 has an edge 13 in contact with the platform surface 12 from which liquid transferred along each wick 11 can be atomized. The fluid is drawn through the wick 11 as a result of the atomization of the fluid at the wick edge 13. The wick 11 can include channels formed by applying a pattern on areas of the wick surface 15 using a hydrophobic material such as wax or photoresist. This allows for more than one fluid to be transferred and/or mixed on the wick surface 15. Three such wicks are shown in FIG. 15 to allow for more than one different liquid to be atomised at the same time from a single piezoelectric actuation platform 1.

Modifications and variations as would be deemed obvious to the person skilled in the art are included within the ambit of the present invention as claimed in the appended claims.

The claims defining the invention are as follows:

1. A piezoelectric actuation platform including a piezoelectric substrate formed from a single crystal piezoelectric material, the piezoelectric substrate defining a platform surface, and
    at least one simple electrode that is brought into contact with the piezoelectric substrate for applying an electrical signal to the substrate such that a lamb wave is generated within said substrate to thereby manipulate liquid droplets, fluids or particles in a fluid located on the platform surface,
    wherein the at least one simple electrode is either (a) in the form of a conductive material which is L-shaped, stripped-shaped, curved or circular-shaped, or (b) a point electrode in contact with a point on the surface of a piezoelectric substrate.

2. A piezoelectric actuation platform according to claim 1 wherein the single crystal piezoelectric material is selected from one of the following group: bulk lithium niobate, thin film lithium niobate, bulk lithium tantalate, thin film lithium tantalate, Gallium Nitride, Quartz, and Langasite.

3. A piezoelectric actuation platform according to claim 1 wherein the simple electrode is in physical contact with a surface of the piezoelectric substrate.

4. A piezoelectric actuation platform according to claim 3, wherein the piezoelectric substrate surface is unpolished.

5. A piezoelectric actuation platform according to claim 3, wherein the simple electrode is a large electrode in contact with the piezoelectric substrate surface.

6. A piezoelectric actuation platform according to claim 5, wherein the simple electrode is in the form of a conductive sheet material.

7. A piezoelectric actuation platform according to claim 3, wherein the simple electrode is a point electrode in contact with a point on the piezoelectric substrate surface.

8. A piezoelectric actuation platform according to claim 1 further including a power supply for supplying the electrical signal at one or more frequencies substantially matching a resonant frequencies of the piezoelectric substrate.

* * * * *